(12) United States Patent
Fukumoto

(10) Patent No.: US 6,236,081 B1
(45) Date of Patent: May 22, 2001

(54) AND-TYPE NON-VOLATILE SEMICONDUCTOR MEMORY DEVICE AND METHOD OF MANUFACTURING THEREOF

(75) Inventor: Atsushi Fukumoto, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/215,228

(22) Filed: Dec. 18, 1998

(30) Foreign Application Priority Data

Jul. 14, 1998  (JP) .................................................. 10-198871

(51) Int. Cl.[7] .................................................. H01L 29/76
(52) U.S. Cl. .......................... 257/314; 257/315; 257/316
(58) Field of Search ..................................... 257/314, 315, 257/316, 317, 321; 438/201, 211, 257, 266

(56) References Cited

U.S. PATENT DOCUMENTS

5,569,946  * 10/1996  Hong ..................................... 257/316
5,610,420  *  3/1997  Kuroda et al. ........................ 257/315

FOREIGN PATENT DOCUMENTS

7-142618   6/1995  (JP) .
11040780 *  2/1999  (JP) .

* cited by examiner

Primary Examiner—Olik Chaudhuri
Assistant Examiner—Hoai Pham
(74) Attorney, Agent, or Firm—McDermott, Will & Emery

(57) ABSTRACT

An interlayer insulating film is formed by the CVD method to cover a side surface of lower floating gate, and the top surface of said interlayer insulating film is planarized. An upper floating gate is formed extending over lower floating gate and interlayer insulating film. A control gate is formed on upper floating gate with an insulating film therebetween.

2 Claims, 9 Drawing Sheets

AND-TYPE NON-VOLATILE SEMICONDUCTOR MEMORY DEVICE AND METHOD OF MANUFACTURING THEREOF

BACKGROUND OF THE INVENTION

1. Field of the Invention

The present invention relates to a structure and a manufacturing method of manufacturing an AND-type non-volatile semiconductor memory device.

2. Description of the Background Art

A cross sectional structure of a memory cell in an AND-type flash memory which is an example of a conventional AND-type non-volatile semiconductor memory device is shown in FIG. 14. As shown in FIG. 14, a memory cell includes a source 3 and a drain 2, a floating gate 4, a control gate (word line) 5, and an insulating film 11. Source 3 and drain 2 are formed spaced apart on the main surface of a silicon substrate 1. On each side of these a field oxide film 6 is formed, and below the field oxide film 6 a channel stopper 18 is formed.

On the surfaces of source 3 and drain 2, an oxide film 17 is formed by thermally oxidizing of these surfaces.

A floating gate 4 includes a lower floating gate 4b and an upper floating gate 4a. Lower floating gate 4b is formed on the main surface of silicon substrate 1 with a tunnel oxide film 8 therebetween. On a side surface of lower floating gate 4b, a nitride film 15 and an oxide film sidewall 16 are formed. Nitride film 15 is provided to prevent a bird's beak from forming when oxide film 17 is formed.

Upper floating gate 4a extends over lower floating gate 4b and oxide film 17. Consequently, the coupling ratio between floating gate 4 and control gate 5 can be made relatively large, that is, approximately 0.6. On the other hand, the coupling ratio between floating gate 4 and silicon substrate 1 may be kept relatively small, since the area of the base of lower floating gate 4b is made small.

The inventor has independently discovered the following problems inherent in the above-mentioned conventional AND-type flash memory. These problems will be described in relation to FIG. 15 which is an enlarged view of a region 19 in FIG. 14.

It is difficult to prevent the formation of a bird's beak of oxide film 17 completely even if nitride film 15 is formed on a side surface of lower floating gate 4b, and a bird's beak 17a forms as shown in FIG. 15. Since the length of this bird's beak 17a may vary, the coupling ratio between silicon substrate 1 and floating gate 4 may also vary. In addition, due to the formation of bird's beak 17a, the thickness of tunnel oxide film 8 at each end may vary. Consequently, the erase and program characteristics effected by FN (Fowler-Nordheim) tunneling may vary as well.

Moreover, because the Vth distribution during the program/erase operations expands as a result, it is difficult to detect the narrow band Vth by introducing the multivalued technique. The multivalued technique enables one cell to hold a multi-bit data, and which distinguishes the cell states, typically distinguished between only two states using one reference voltage, into more than two states using a plurality of reference voltages.

Further, because of the presence of bird's beak 17a, it is possible that the regions where source/drain regions 3, 2 and the ends of floating gate 4 overlap and where the electrons pass during the program/erase operations may not be large enough. Thus, the ends of source 3 and drain 2 need to extend farther inward toward floating gate 4 than bird's beak 17a. Consequently, the number of thermal diffusion steps increases during the process flow, giving rise to the problem of higher production cost.

Moreover, hydrogen ions and holes are often trapped in nitride film 15 formed on a sidewall of lower floating gate 4b. These hydrogen ions and holes may undesirably couple with the electrons in floating gate 4, causing the electrons in floating gate 4 to be lost. In other words, retention, or the charge-holding characteristic of floating gate 4 into which the electrons are injected, may deteriorate, causing another problem. In addition, the movement of hydrogen ions and holes from nitride film 15 may degrade endurance.

Furthermore, as shown in FIG. 14 and FIG. 15, steps exist on the upper surface of oxide film 17. Specifically, large steps are formed near oxide film sidewall 16 and near field oxide film 6. Consequently, etch residues may be generated in the steps while upper floating gate 4a and control gate 5 are being patterned. In addition, the steps on the surface of oxide film 17 cause a side surface of a developed resist to have a wavelike shape, and the shapes of upper floating gate 4a and control gate 5 may vary. In such a case, adverse effects, especially on the erase characteristic, are to be expected.

SUMMARY OF THE INVENTION

The present invention is intended to provide the solutions to the above-mentioned problems. An object of the invention is to prevent a bird's beak from forming directly beneath the peripheral portion of lower floating gate 4b, to planarize an interlayer insulation film 10 below upper floating gate 4a, and to improve retention and endurance in an AND-type non-volatile semiconductor memory device.

The AND-type non-volatile semiconductor memory device according to the invention is provided with a plurality of memory cells, a first floating gate, an interlayer insulating film, a second floating gate, a control gate, a memory cell array region, and a peripheral circuit region. The plurality of memory cells are formed on the main surface of the semiconductor substrate. The first floating gate is formed on the main surface with a first insulating film of even thickness therebetween. The interlayer insulating film having a flat top surface is formed on the main surface to cover a side surface of the first floating gate by the CVD (Chemical Vapor Deposition) method. The second floating gate extends on the first floating gate and on the interlayer insulating film. The control gate is formed on the second floating gate with a second insulating film therebetween. The memory cells are formed within the memory cell array region. The peripheral circuit for controlling the operation of the memory cells is formed in the peripheral circuit region. The width (D1 in FIG. 4 and FIG. 5) of the boundary region located near the boundary between the peripheral circuit region and the memory cell array region is 1 to 1.5 times the distance between first floating gates of the memory cells aligned in the direction in which the control gate extends.

As described above, the interlayer insulating film formed by the CVD method can prevent the generation of bird's beak directly beneath the floating gate. Moreover, the reduction of the thickness of the interlayer insulating film facilitates the planarization of the top surface of the interlayer insulating film. Thus, after patterning the second floating gate and the control gate, the generation of etch residues is also suppressed. In addition, there will be no need to form a nitride film on a side surface of the first floating gate. Further, the inventor has found that, by making the above-mentioned width of the boundary region 1 to 1.5 times the distance between the first floating gates of the memory cells in the direction in which the control gate extends, when the interlayer insulating film is reduced in thickness to planarize its top surface, it is possible to prevent the thickness of the interlayer insulating film at the boundary region from becoming excessively thinner than the thickness of the interlayer insulating film in other parts. Thus, when planarizing the interlayer insulating film, problems such as exposure of the substrate at the boundary region can be avoided.

The top surface of the interlayer insulating film preferably is equal to or higher in level than the top surface of the first floating gate.

Thus, the second floating gate can be prevented from extending toward the substrate, and the generation of unnecessary capacitance between the second floating gate and the substrate is prevented.

The method of manufacturing the AND-type non-volatile semiconductor memory device according to the present invention includes the following steps. On the main surface of a semiconductor substrate a first insulating film is formed, on the first insulating film a first floating gate is formed, and on the first floating gate a mask film is formed. To cover the mask film, an interlayer insulating film is formed by the CVD method. The thickness of the interlayer insulating film is reduced to planarize the top surface of the interlayer insulating film and to expose the top surface of the mask film. The mask film is removed while the thickness of the interlayer insulating film is further reduced. A second floating gate is formed extending on the first floating gate and on the interlayer insulating film. On the second floating gate a control gate is formed with a second insulating film therebetween.

As described above, by forming the interlayer insulating film by the CVD method, the generation of bird's beak is prevented, and the formation of a nitride film on a side surface of the first floating gate is no longer required. In addition, by forming the mask film on the first floating gate, the first floating gate is protected from possible damages caused during the reduction of the thickness of the interlayer insulating film. Moreover, reducing the thickness of the interlayer insulating film leads to planarization of the top surface of the interlayer insulating film.

The step of removing the mask film preferably includes the following first and second etching steps. The first etching step involves etching the interlayer insulating film to make the top surface of the interlayer insulating film lower than the top surface of the mask film. The second etching step involves etching the mask film and the interlayer insulating film after the first etching step to expose the top surface of the first floating gate and to make the top surface of the interlayer insulating film as high as or higher in level than the top surface of the first floating gate.

By making the top surface of the interlayer insulating film lower than the top surface of the mask film in the first etching step, the mask film and the interlayer insulating film may be etched to make the top surface of the interlayer insulating film as high as or slightly higher than the top surface of the first floating gate in the second etching step. Particularly, when the top surfaces of the interlayer insulating film and the first floating gate are made equal in level, the underlying layer of the second floating gate and the control gate can be planarized, so that the second floating gate and the control gate may be patterned with ease.

The interlayer insulating film is preferably an oxide film, and the mask film preferably includes a nitride film. In this case, the first etching step includes a wet etching step using hydrofluoric acid, and the second etching step includes a wet etching step using hot phosphoric acid.

Moreover, the mask film may include an oxide film and a polysilicon (polycrystalline silicon) film formed thereon. In this case, the first etching step includes a wet etching step using hydrofluoric acid, and the second etching step includes a wet etching step using hydrofluoric acid and nitric acid.

In this manner, as an oxide film and a polysilicon film are included in the mask film, the deformation of the first floating gate is better prevented than the case in which a nitride film is used as the mask film. As a result, the occurrence of a crystal defect in the substrate caused by the deformation of the first floating gate can be suppressed, and the reliability of the non-volatile semiconductor memory device is improved.

The AND-type non-volatile semiconductor memory device preferably includes a memory cell array region where a plurality of memory cells, each having first and second floating gates and a control gate, are formed, and a peripheral circuit region which is disposed adjacent to the memory cell array region and where a peripheral circuit which controls the operation of the memory cells is formed. As such, the width of the boundary region located near the boundary between the memory cell array region and the peripheral circuit region is 1 to 1.5 times the distance between the first floating gates of the memory cells aligned in the direction in which the control gate extends. Further, the step of reducing the thickness of the interlayer insulating film preferably includes a step of reducing the thickness of the interlayer insulating film by CMP (Chemical Mechanical Polishing) while planarizing the top surface of the interlayer insulating film. Furthermore, the width of the boundary region is herein defined as referring to the distance D1 between the end on the memory cell array region side of a conductive layer 20 in the peripheral circuit region and the first floating gate (lower floating gate 4b) closest to the boundary line between the memory cell array region and the peripheral circuit region as shown in FIG. 5.

By defining the width of the boundary region in the above-described manner, the interlayer insulating film in the boundary region is prevented from becoming excessively thin when the thickness of the interlayer insulating film is reduced by CMP. Thus, problems such as exposure of a substrate surface in the boundary region during the reduction of the thickness of the interlayer insulating film by CMP are avoided, and the thickness of the interlayer insulating film can be reduced easily and stably while its top surface is planarized.

The foregoing and other objects, features, aspects and advantages of the present invention will become more apparent from the following detailed description of the present invention when taken in conjunction with the accompanying drawings.

DESCRIPTION OF THE PREFERRED EMBODIMENT

Figure 1:
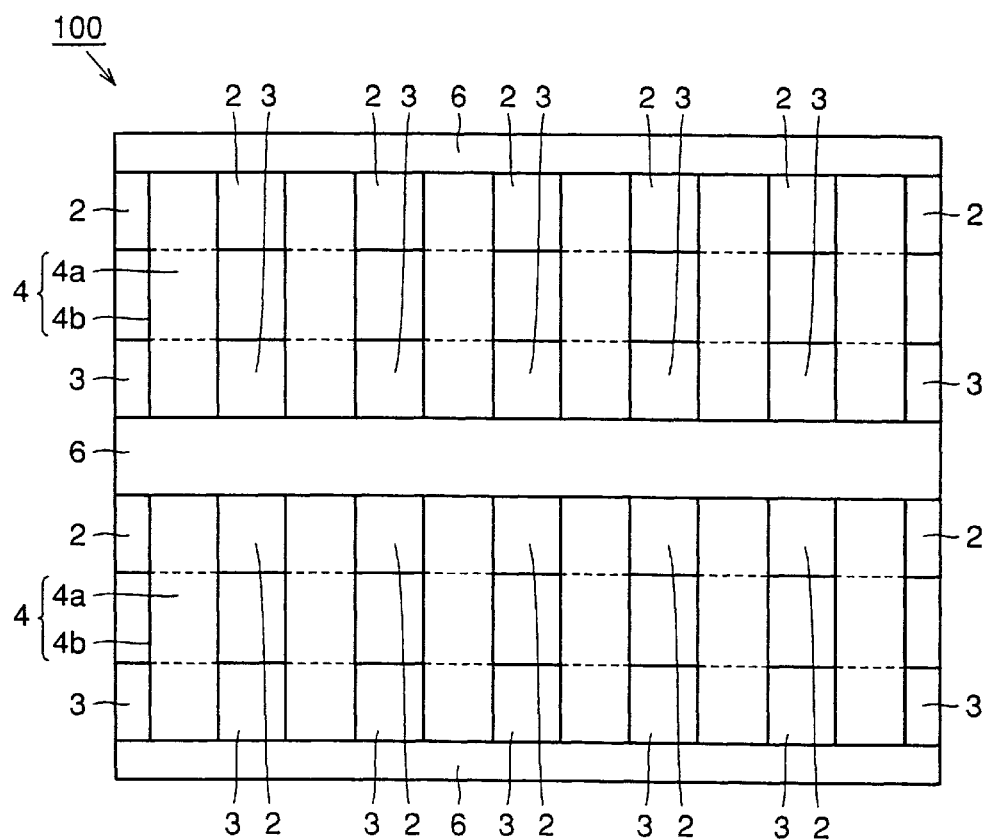
FIG. 1 is a plan view of a memory cell array region in an AND-type flash memory.

An embodiment of the present invention will be described below with reference to FIGS. 1–13. FIG. 1 is a plan view of a memory cell array region 100 of the AND-type flash memory according to the invention. For convenience of description, only components up to upper floating gate 4a is shown.

As shown in FIG. 1, a plurality of memory cells are formed in memory cell array region 100. Each memory cell is provided with a drain 2, a source 3, a floating gate 4, and a control gate (not shown). Floating gate 4 includes an upper floating gate 4a and a lower floating gate 4b.

A plurality of field oxide films 6 are formed in parallel. Drains 2 and sources 3 disposed between field oxide films 6 are respectively continuous along field oxide films 6. Moreover, the control gate is provided extending in a direction perpendicular to the longitudinal direction of field oxide film 6.

Figure 2:
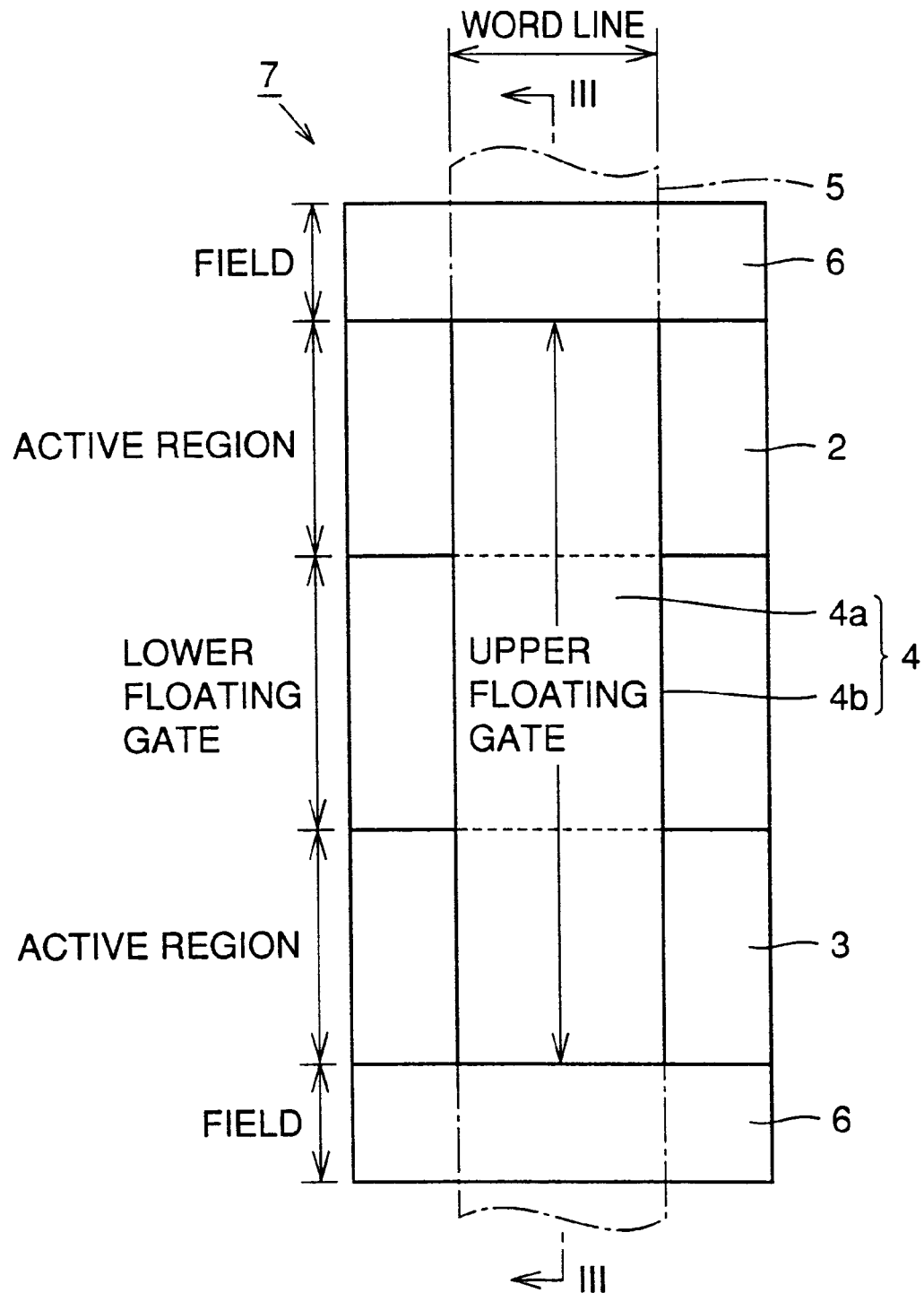
FIG. 2 is a plan view showing a single memory cell.

FIG. 2 shows a single memory cell 7. As shown, upper floating gate 4a extends over drain 2 and source 3. Control gate (word line) 5 is provided on upper floating gate 4a with an insulating film therebetween.

Figure 3:
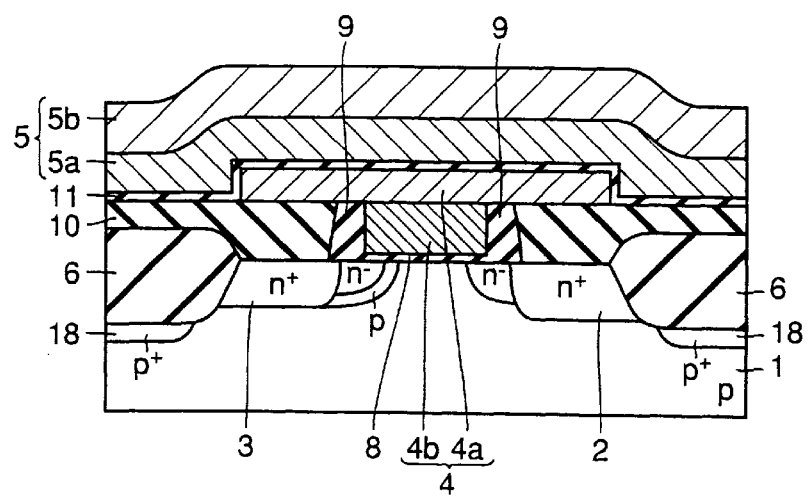
FIG. 3 is a cross sectional view taken along the line III—III in FIG. 2.

FIG. 3 shows a cross sectional view taken along the line III—III in FIG. 2. As shown in FIG. 3, drain 2 and source 3 are formed spaced apart on the main surface of silicon substrate 1. The structures of drain 2 and source 3 differ in that only source 3 is provided with a p-type impurity region. Lower floating gate 4b is formed on the main surface of silicon substrate 1 with a tunnel oxide film 8 therebetween. An oxide film sidewall 9 is formed directly on a side surface of lower floating gate 4b. An interlayer insulating film 10 is formed on the main surface to cover oxide film sidewalls 9. Interlayer insulating film 10 is made of silicon oxide film, for example, and is formed by the CVD method. Thus, no bird's beaks form directly beneath the peripheral portion of lower floating gate 4b, and tunnel oxide film 8 will be of uniform thickness.

Further, the top surface of interlayer insulating film 10 is planarized. Therefore, the generation of etch residues is prevented effectively while upper floating gate 4a and control gate 5 are patterned as described below, the patterning being easily effected.

Furthermore, although the top surfaces of lower floating gate 4b and interlayer insulating film 10 are shown to be of the same level in FIG. 3, the top surface of interlayer insulating film 10 may be set slightly higher than the top surface of lower floating gate 4b. Upper floating gate 4a is thus prevented from extending toward silicon substrate 1, and the generation of unnecessary capacitance between upper floating gate 4a and silicon substrate 1 is prevented effectively.

Upper floating gate 4a is formed extending over lower floating gate 4b and interlayer insulating film 10. An insulating film 11 is formed on interlayer insulating film 10, covering upper floating gate 4a. An example of the material of insulating film 11 is a stacked film including oxide film/nitride film/oxide film/nitride film.

Control gate 5 is formed on insulating film 11. Control gate 5 is formed of a stacked film including, for example, a doped polysilicon film 5a and a refractory metal (metal having high melting point) silicide film 5b.

Figure 4:
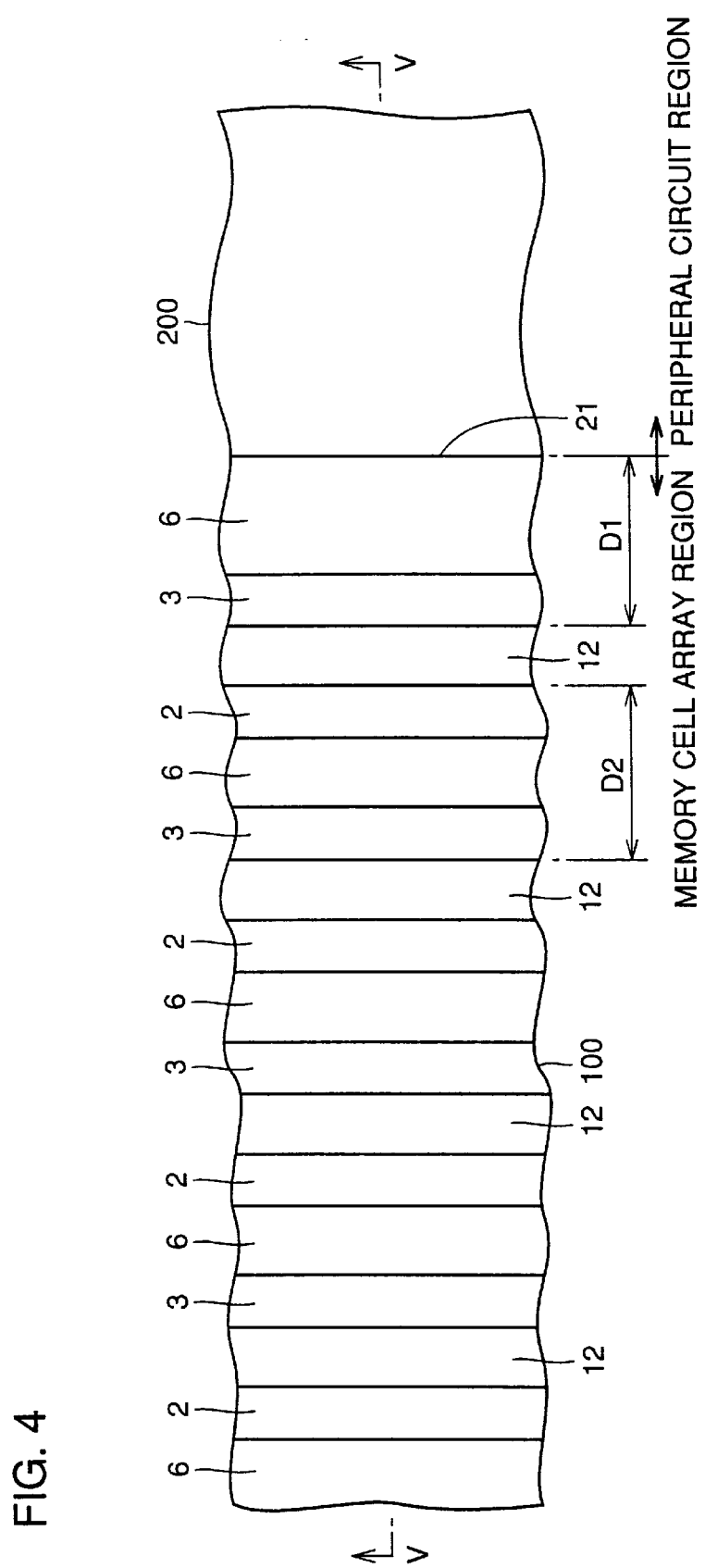
FIG. 4 is a plan view representing the relation between a distance D2 between the lower floating gates and width D1 of the boundary region between the memory cell array region and the peripheral circuit region.
Figure 5:
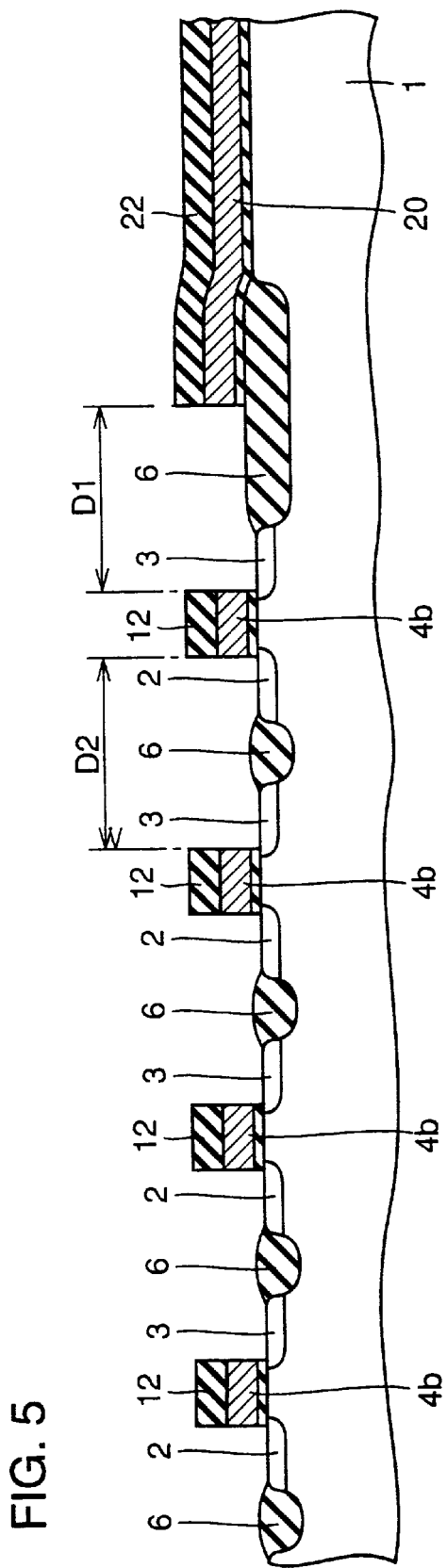
FIG. 5 is a cross sectional view taken along the line V—V in FIG. 4.

Referring now to FIGS. 4 and 5, another feature of the AND-type flash memory according to the present invention will be described. For convenience of description, FIGS. 4 and 5 show lower floating gate 4b with a mask film (as described later) formed thereon.

Referring to FIGS. 4 and 5, a peripheral circuit region 200 is disposed adjacent to memory cell array region 100. A peripheral circuit which controls the operation of a memory cell is formed in peripheral circuit region 200. The region located between the lower floating gate 4b closest to peripheral circuit region 200 and the boundary 21 between peripheral circuit region and memory cell array region (the end of a conductive film 20 or a mask film 22 in peripheral circuit region 200 on memory cell array region 100 side) is referred to as the boundary region.

It is preferred that width D1 of the boundary region is 1 to 1.5 times the distance D2 between lower floating gates 4b of two memory cells aligned in the direction in which the control gate (not shown) extends.

The inventor has found that by setting width D1 within such range, it is possible, when reducing the thickness of interlayer insulating film 10 to planarize its top surface, to prevent interlayer insulating film 10 located on the boundary region from being reduced in shorter time period than other parts of interlayer insulating film 10. Therefore, during the reduction of interlayer insulating film 10 thickness, problems such as exposure of the surface of silicon substrate 1 in the boundary region can be avoided, and the thickness of interlayer insulating film 10 may be easily reduced. What is more, the reliability of a flash memory after the reduction of interlayer insulating film 10 thickness is improved.

Next, the method of manufacturing the AND-type flash memory according to the present invention will be described in reference to FIGS. 6–13.

Figure 6:
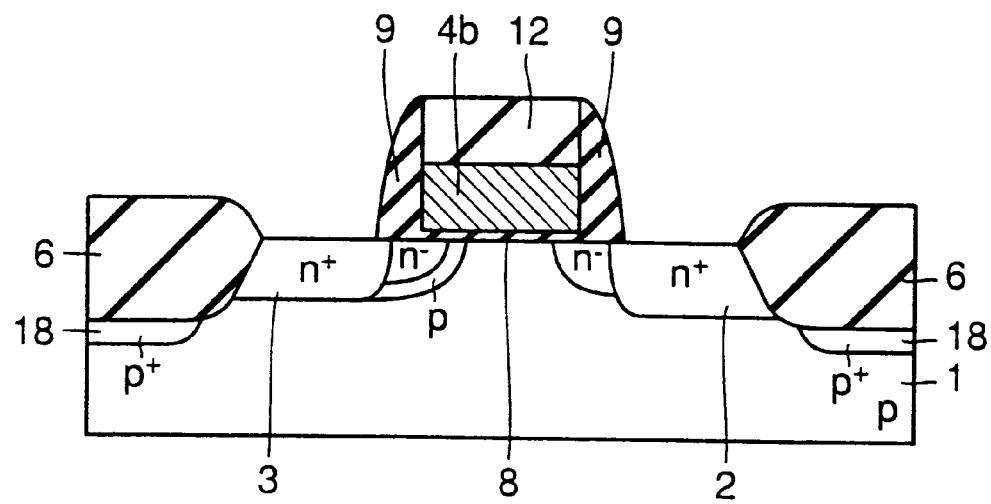
FIGS. 6–12 are cross sectional views depicting the first to seventh steps characterizing the manufacturing steps of the AND-type flash memory in accordance with the present invention.

Referring to FIG. 6, after forming a channel stopper 18 and field oxide film 6 having a thickness of about 400 nm by a well-known method, a thin oxide film having a thickness of about 10 nm is formed in a region between field oxide films 6. This later becomes tunnel oxide film 8. On this thin oxide film, a polysilicon film having a thickness of about 100 nm and a nitride film having a thickness of about 150 nm are formed successively, and are patterned to have a width of about 0.4 $\mu$m. In this manner, lower floating gate 4b and mask film 12 are formed.

Then, boron is implanted into the region where source 3 is formed, for example at 30 keV with a dosage of $1.0 \times 10^{14}$ cm$^{-2}$. Thus, a p-type impurity region is formed only on source 3 side. Then, using mask film 12 as a mask, arsenic is implanted into both the source 3 side and the drain 2 side, at 50 keV with a dosage of $3.5 \times 10^{14}$ cm$^{-2}$ for the source side and at 50 keV with a dosage of $6.0 \times 10^{15}$ cm$^{-2}$ for the drain side.

Next, after the deposition of an oxide film having a thickness of about 200 nm, isotropic etching is performed to form oxide film sidewalls 9. Thereafter, using oxide film sidewalls 9 and mask film 12 as a mask, arsenic is implanted on source 3 side and drain 2 side at 50 keV with a dosage of $3.0 \times 10^{15}$ cm$^{-2}$. By forming mask film 12 in the above-described manner, lower floating gate 4b is protected during the impurity implantation for source/drain regions.

Figure 7:
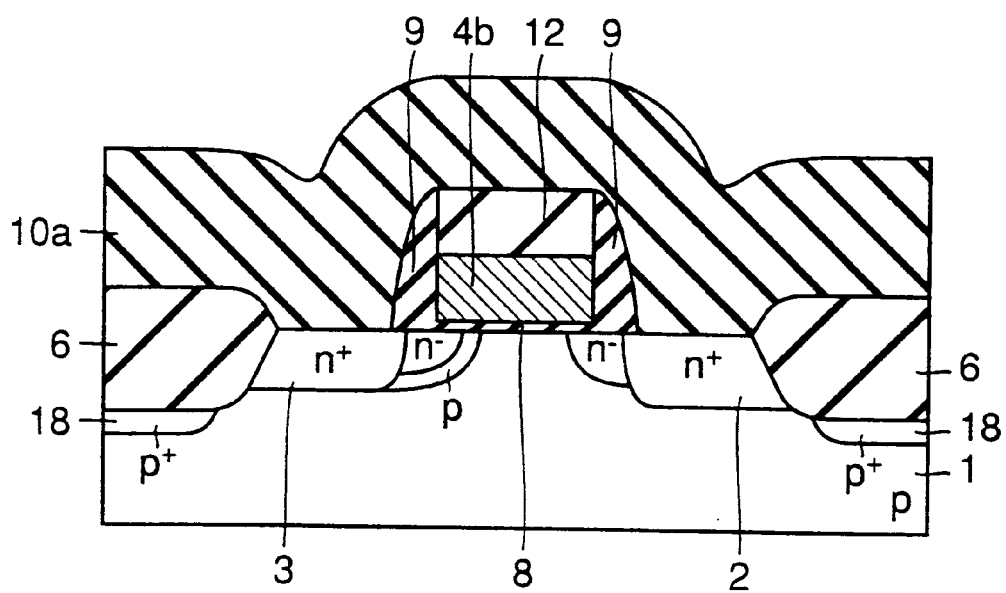

Next, as shown in FIG. 7, an insulating film such as a silicon oxide film is deposited on the entire surface by the CVD method. More specifically, about 300 nm of a TEOS (Tetraethylorthosilicate) oxide film is deposited at 750° C., for instance.

Figure 8:
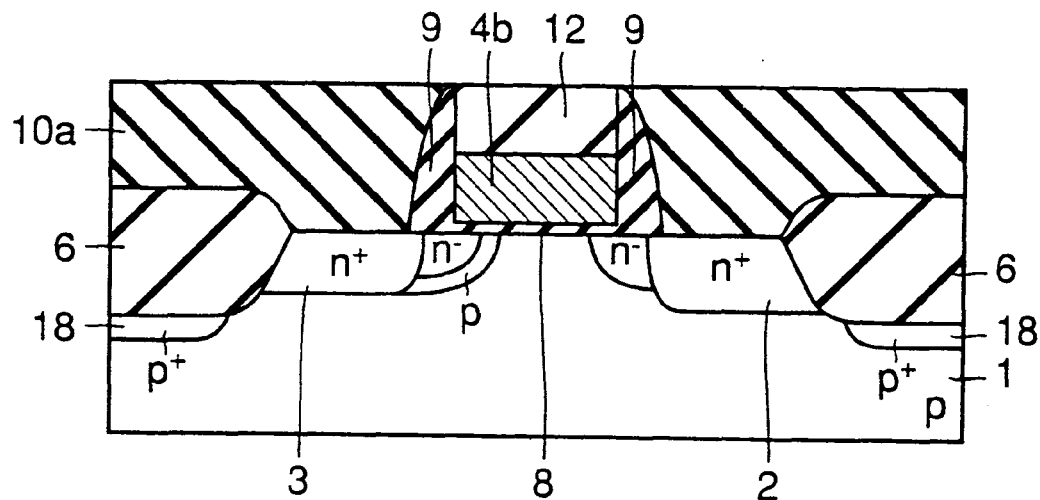

Referring now to FIG. 8, the thickness of an insulating film 10a is reduced using techniques such as CMP and etch back so as to planarize the top surface of insulating film 10a while exposing the top surface of mask film 12. When CMP is employed, width D1 of the boundary region between the memory cell region and the peripheral circuit region is made to be 1 to 1.5 times the distance D2 between lower floating gates 4b of the memory cells that line up in the direction in which the control gate extends as described above so that insulating film 10a in the boundary region is effectively prevented from becoming too thin. Thus, the reliability of the flash memory is improved.

Figure 9:
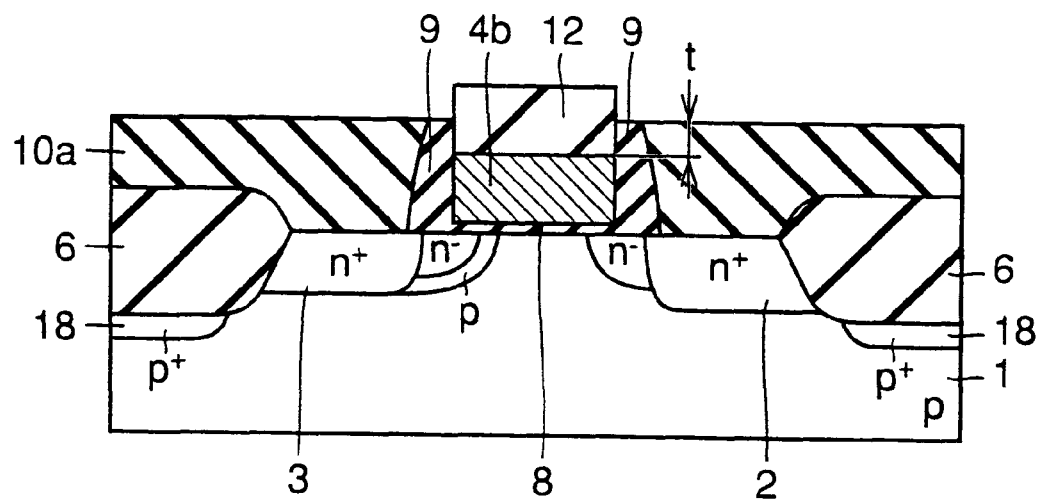

Referring now to FIG. 9, insulating film 10a is wet etched. If insulating film 10a is a silicon oxide film, wet etching is effected using hydrofluoric acid, and the top surface of insulating film 10a is made lower than the top surface of mask film 12. At this time, the thickness t, which is the distance from the base surface of mask film 12 to the top surface of insulating film 10a, should be the same as the thickness of insulating film 10a that will be etched later in the step of wet etching mask film 12. In other words, thickness t is a value determined in consideration of the etch selectivity of mask film 12 to insulating film 10a during wet etching.

Figure 10:
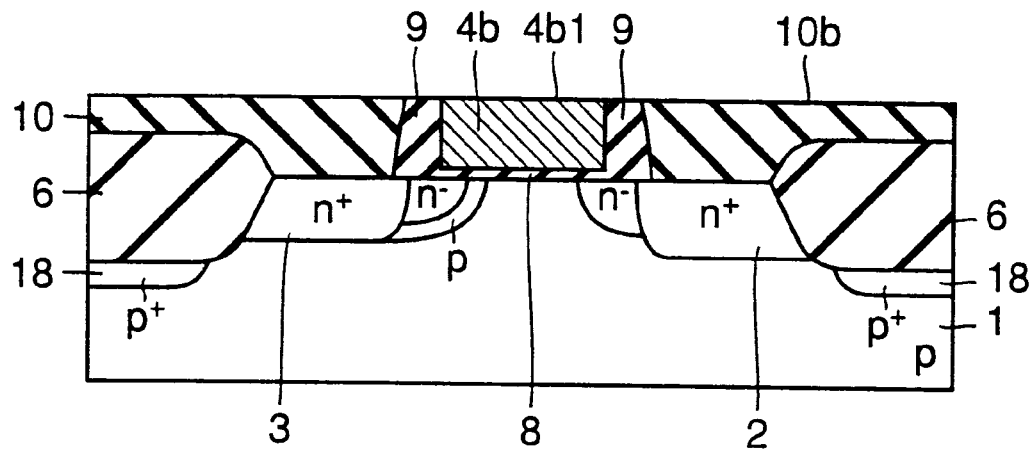

Referring now to FIG. 10, mask film 12 is removed by wet etching. If mask film 12 is a nitride film, wet etching is effected using hot phosphoric acid. Insulating film 10a is thus etched by the thickness t while mask film 12 is removed. As a result, an exposed top surface 4b1 of lower floating gate 4b and a top surface 10b of interlayer insulating film 10 become equal in level. Moreover, by adjusting the value of thickness t, top surface 10b may be made higher than top surface 4b1.

Figure 13:
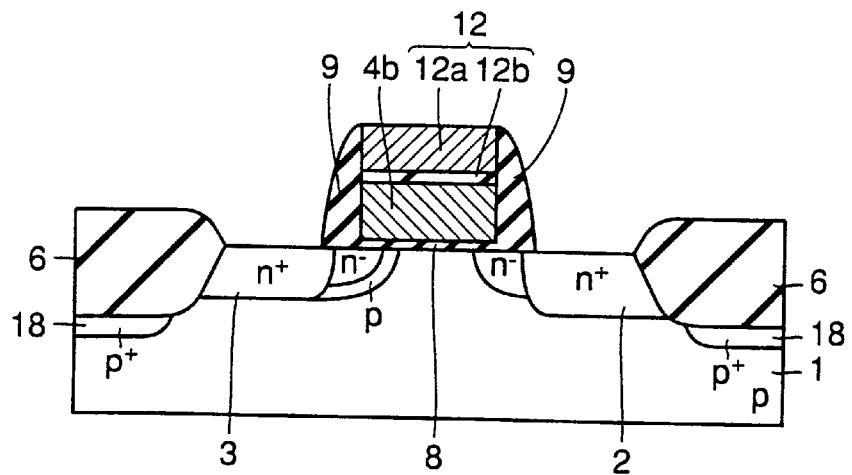
FIG. 13 is a cross sectional view illustrating a variation of a structure of the mask film in accordance with the present invention.
Figure 14:
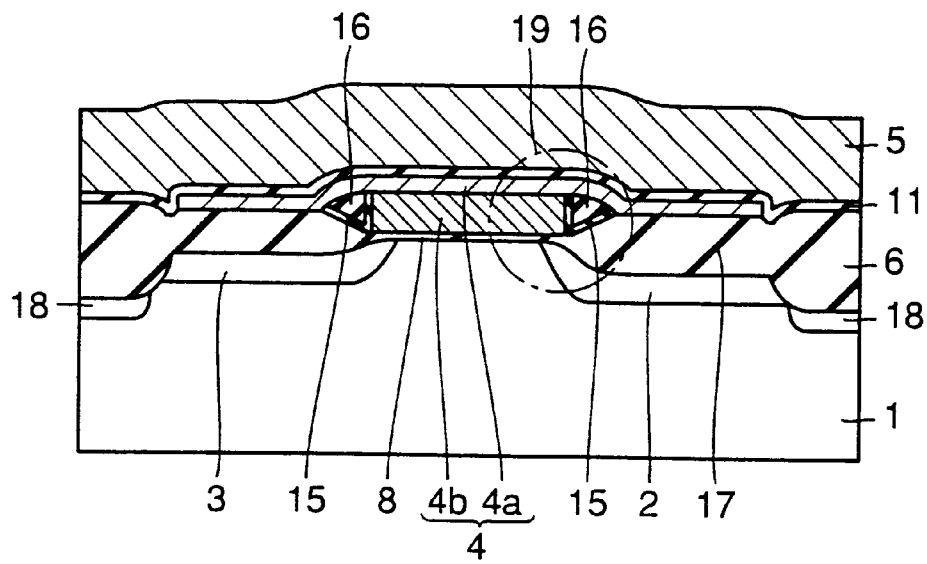
FIG. 14 is a cross sectional view of a memory cell of a conventional AND-type flash memory.
Figure 15:
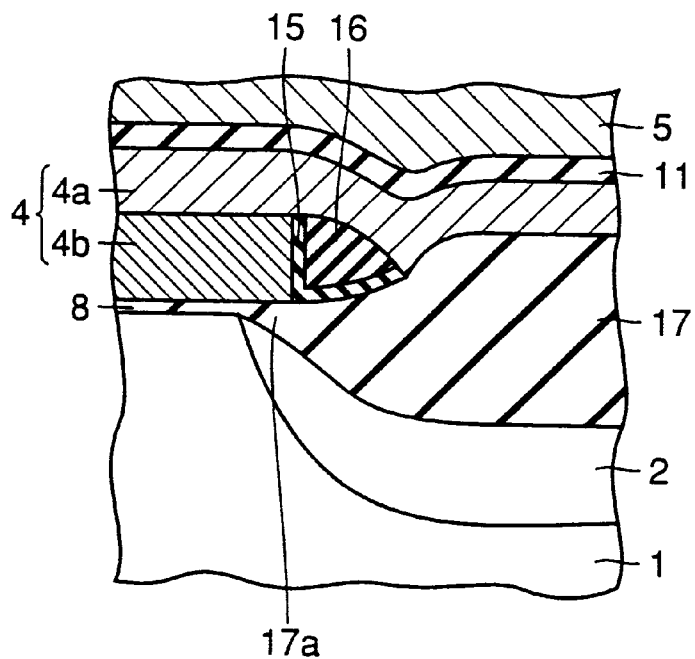
FIG. 15 is an enlarged cross sectional view showing region 19 in FIG. 14.

Now, a variation of the structure of mask film 12 is described with reference to FIG. 13. As shown, mask film 12 may be formed of an oxide film 12b and a polysilicon film 12a. In this case, oxide film 12b should be about 15 nm thick, and polysilicon film 12a should be about 150 nm thick. Polysilicon film 12a and oxide film 12b may be formed by the CVD method.

If the nitride film is formed directly on lower floating gate 4b, hydrogen ions and holes trapped in the nitride film may possibly move into lower floating gate 4b. By employing a stacked structure of oxide film 12b and polysilicon film 12a as in this example, however, the entrance of hydrogen ions and holes into the floating gate is prevented. Thus, it is possible to improve the reliability (retention and endurance) of the flash memory.

In addition, by employing the stacked structure, the stress on lower floating gate 4b is reduced compared to the case in which the nitride film is formed directly on lower floating gate 4b. Consequently, the deformation of lower floating gate 4b is prevented, and occurrence of a crystal defect in silicon substrate 1 caused by such deformation is also prevented, which contributes to the improvement in the reliability of the flash memory.

When mask film 12 has a stacked structure formed of oxide film 12b and polysilicon film 12a as described above, the etching of insulating film 10a as illustrated in FIG. 9 may be performed by wet etching using hydrofluoric acid, and the etching of mask film 12 as illustrated in FIG. 10 may be performed by wet etching using hydrofluoric acid and nitric acid. Here, as described earlier, top surface 10b of interlayer insulating film 10 and top surface 4b1 of lower floating gate 4b can be made flush.

Figure 11:
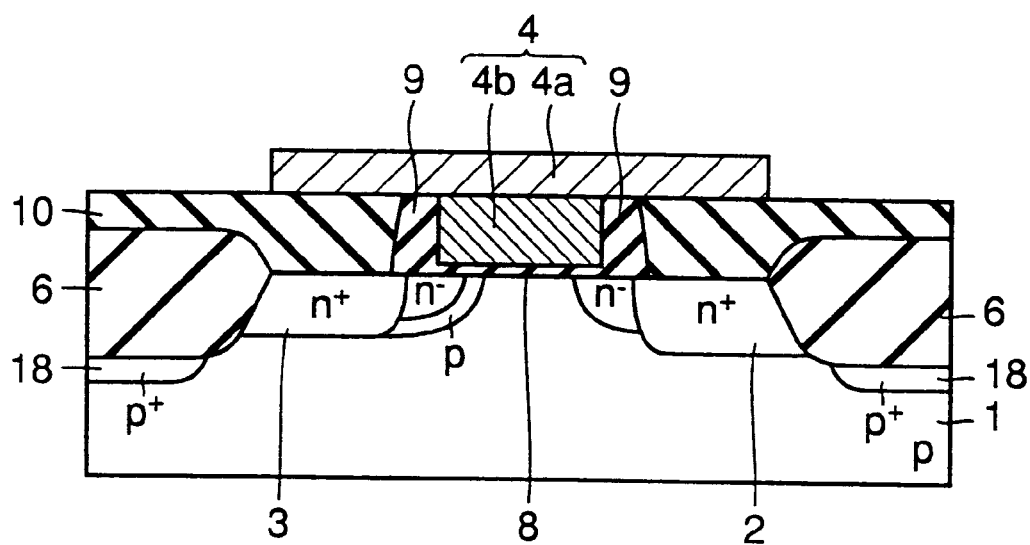

Referring now to FIG. 11, an impurity-doped polysilicon film is formed by the CVD method or the like. The doped polysilicon film is patterned to form upper floating gate 4a. At this time, since the top surface 10b of interlayer insulating film 10 is planarized, the generation of etch residues is effectively prevented, and upper floating gate 4a is easily patterned.

Figure 12:
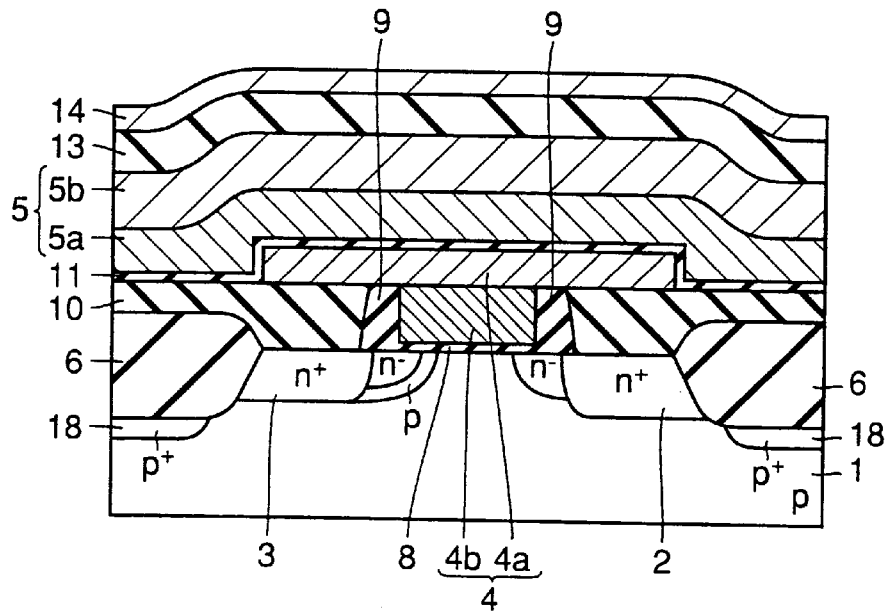

Next, referring to FIG. 12, thin insulating film 11 is deposited to cover upper floating gate 4a. For instance, TEOS film about 5 nm thick, a silicon nitride film ($Si_3N_4$) about 9 nm thick, TEOS film about 3 nm thick, and a silicon nitride film about 13 nm thick are successively deposited by the CVD method.

Then, a doped polysilicon film 5a having a thickness of about 100 nm is formed covering insulating film 11, and refractory metal silicide film 5b such as Wsi having a thickness of about 100 nm is deposited thereon. On refractory metal silicide film 5b an oxide film 13 such as TEOS about 200 nm thick is deposited, and on oxide film 13 a doped polysilicon film 14 about 150 nm thick is deposited.

A resist (not shown) is applied on polysilicon film 14, and is patterned in the direction of a word line. By using this resist, polysilicon film 14 and oxide film 13, in this order, are etched. Thereafter, the resist is removed, and using polysilicon film 14 and oxide film 13 as a mask, refractory metal silicide film 5b, doped polysilicon 5a, insulating film 11, and floating gate 4 are etched successively. From the steps described above, a memory cell is formed.

As described above, according to the present invention, the formation of a bird's beak beneath the floating gate is prevented since there is no need for thermal oxidation when the floating gate is formed. Consequently, it is possible to make uniform the thickness of the tunnel insulating film, which electrons pass through by the FN tunneling during program/erase operations. As a result, variation of program/erase characteristics within the memory cell array can be suppressed. Consequently, the width of Vth distribution after program/erase can be narrowed. Thus, Vth may be distributed at multiple levels for the flash memory to serve as a multivalued memory, making higher degrees of integration possible in the future.

In addition, since the top surface of the interlayer insulating film can be planarized, the second floating gate and the control gate can be easily patterned.

Moreover, since thermal oxidation is not necessary when the floating gate is formed, there is no need to form the nitride film on a sidewall of the floating gate. Thus, reliability such as retention and endurance is improved.

Furthermore, by properly adjusting the width of the boundary region between the memory cell array region and the peripheral circuit region, the top surface of the interlayer insulating film can be planarized with ease, and the reliability of the AND-type non-volatile semiconductor memory device is also improved.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An AND-type non-volatile semiconductor memory device, comprising:

a plurality of memory cells formed on a main surface of a semiconductor substrate;

a first floating gate of each of said memory cells formed on said main surface with a first insulating film of uniform thickness therebetween;

an interlayer insulating film having a flat top surface and formed on said main surface by Chemical Vapor Deposition method to cover a side surface of said first floating gate;

a second floating gate of each of said memory cells extending on said first floating gate and on said interlayer insulating film;

a control gate of each of said memory cells formed on said second floating gate with a second insulating film therebetween;

a memory cell array region where said memory cells are formed; and a peripheral circuit region in which a peripheral circuit controlling operation of said memory cells is formed, width of a boundary region located near a boundary between said memory cell array region and said peripheral circuit region being 1 to 1.5 times the distance between said first floating gates of said memory cells aligned in the direction in which said control gate extends.

2. The AND-type non-volatile semiconductor memory device according to claim 1, wherein a top surface of said interlayer insulating film is as high as or higher than a top surface of said first floating gate.

* * * * *